United States Patent
Watanabe

(10) Patent No.: US 8,660,509 B2
(45) Date of Patent: Feb. 25, 2014

(54) MOBILE TERMINAL STATION AND SYNCHRONOUS CONTROL METHOD

(75) Inventor: Masahiro Watanabe, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 372 days.

(21) Appl. No.: 12/985,056

(22) Filed: Jan. 5, 2011

(65) Prior Publication Data

US 2011/0111716 A1   May 12, 2011

Related U.S. Application Data

(63) Continuation of application No. PCT/JP2008/062501, filed on Jul. 10, 2008.

(51) Int. Cl.
*H04B 1/06* (2006.01)
*H04K 3/00* (2006.01)

(52) U.S. Cl.
USPC ..................... 455/245.1; 455/238.1

(58) Field of Classification Search
USPC .......... 455/232.1, 234.1–234.2, 238.1, 245.1; 375/345
See application file for complete search history.

(56) References Cited

U.S. PATENT DOCUMENTS

| 7,995,666 B1 * | 8/2011 | Zhao et al. ................ 375/260 |
| 2004/0190653 A1 | 9/2004 | Yasui et al. |
| 2007/0189229 A1 | 8/2007 | Li et al. |

FOREIGN PATENT DOCUMENTS

| JP | 06244754 A | 9/1994 |
| JP | 08149542 | 6/1996 |
| JP | 2000174829 A | 6/2000 |
| JP | 2001326965 A | 11/2001 |
| JP | 2003115773 | 4/2003 |
| JP | 2003124909 | 4/2003 |
| JP | 2003234665 | 8/2003 |
| JP | 2004072645 | 4/2004 |
| JP | 2004208175 | 7/2004 |
| JP | 2004297673 | 10/2004 |
| JP | 2006094169 A | 4/2006 |
| JP | 2007020048 A | 1/2007 |
| JP | 2007501547 | 1/2007 |
| JP | 2008131363 A | 6/2008 |

OTHER PUBLICATIONS

International Search Report dated Aug. 5, 2008 in corresponding International application No. PCT/JP2008/062501.
Japanese Office Action dated Sep. 13, 2011 issued in application 2010-519600.

* cited by examiner

*Primary Examiner* — Lee Nguyen
(74) *Attorney, Agent, or Firm* — Smith, Gambrell & Russell, LLP

(57) ABSTRACT

A mobile terminal station sets a fixed gain set value that is a predetermined gain value at initial synchronization and amplifies a received signal received from a wireless base station in accordance with the set fixed gain set value. Then, the mobile terminal station detects a synchronizing signal pattern from the amplified received signal, and controls to perform an automatic gain control by using the fixed gain set value as the initial value of the automatic gain control when the synchronizing signal pattern is detected and modifies the fixed gain set value when the synchronizing signal pattern is not detected.

20 Claims, 13 Drawing Sheets

| FIXED GAIN SET VALUE | SYNCHRONIZATION DETECTION TIME |
|---|---|
| $G_0 = 0$ [dB] | A sec |
| $G_1 = S$ [dB] | B sec |
| $G_2 = 2S$ [dB] | C sec |

FIG.8

| a SPOT | |
|---|---|
| FIXED GAIN SET VALUE | SYNCHRONIZATION DETECTION TIME |
| $G_0 = 0$ [dB] | A sec |
| $G_1 = S$ [dB] | B sec |
| $G_2 = 2S$ [dB] | C sec |

| b SPOT | |
|---|---|
| FIXED GAIN SET VALUE | SYNCHRONIZATION DETECTION TIME |
| $G_0 = 0$ [dB] | A sec |
| $G_1 = 2S$ [dB] | D sec |
| $G_2 = 4S$ [dB] | E sec |

| c SPOT | |
|---|---|
| FIXED GAIN SET VALUE | SYNCHRONIZATION DETECTION TIME |
| $G_0 = 0$ [dB] | F sec |
| $G_1 = S$ [dB] | B sec |
| $G_2 = 2S$ [dB] | C sec |

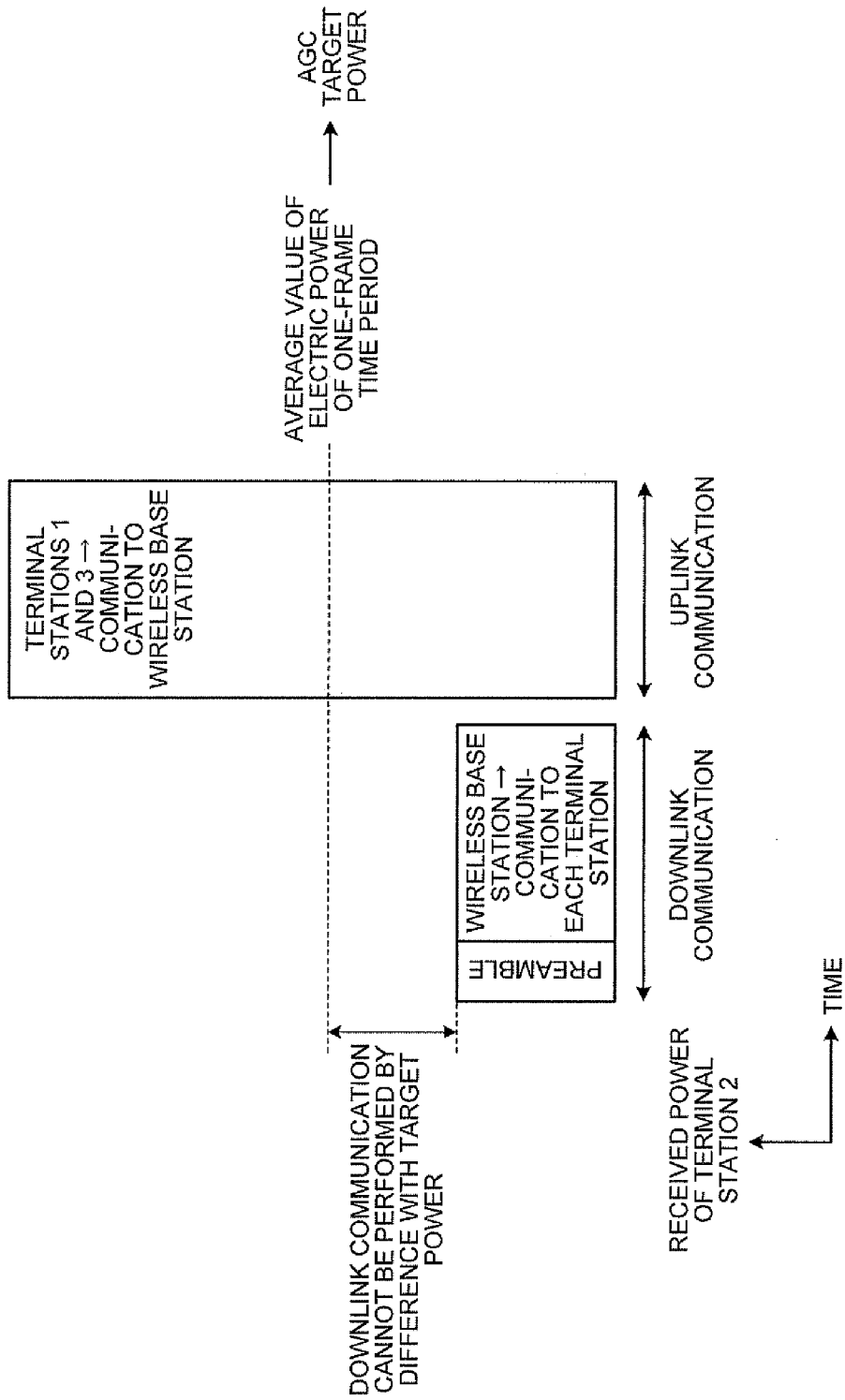

MOBILE TERMINAL STATION AND SYNCHRONOUS CONTROL METHOD

CROSS-REFERENCE TO RELATED APPLICATION

This application is a continuation of International Application No. PCT/JP2008/062501, filed on Jul. 10, 2008, the entire contents of which are incorporated herein by reference.

FIELD

The embodiments discussed herein are directed to a mobile terminal station and a synchronous control method for controlling synchronization in mobile communication.

BACKGROUND

In recent mobile communications, the distribution of rich contents such as Internet access, streaming broadcasting, music, and images is increasing and further a data communication application is expanding, instead of verbal communication-oriented communications in a conventional portable telephone.

In order to correspond to such a request, Mobile WiMAX is employing, for example, a TDD communication method.

Moreover, because a mobile terminal station (hereinafter, "terminal station") for mobile communication has a wide dynamic-range received power received from a wireless base station, the terminal station performs a process for controlling the gain of a receiving amplifier to correspond to the change of the received power.

There has been known automatic gain control (AGC) as a mechanism that automatically performs a process for controlling a gain. The technique has been known as disclosed in, for example, Japanese National Publication of International Patent Application No. 2007-501547 and Japanese Laid-open Patent Publication No. 2003-124909. Specifically, in the case of AGO, a received power is measured and the adjustment of a gain is performed in accordance with the measured received power.

However, in the case of TDD communication, a wireless frame is time-divided into a downlink communication time that is used for communication from a wireless base station to a terminal station and an uplink communication time that is used for communication from a terminal station to a wireless base station. Moreover, when multi access by which a plurality of terminal stations communicate with one wireless base station is performed, the plurality of terminal stations performs communication within an uplink communication time (see FIGS. 13 and 14).

A terminal station adjusts the gain of the received power of an electric wave transmitted by a wireless base station in order to perform a reception. For example, because reception timing is not recognized by a receiver at initial synchronization such as the application of power, there may be a problem that the terminal station is difficult to correctly adjust a gain.

For example, when an own terminal station that performs initial synchronization is located at a long distance from a wireless base station and another terminal station that communicates with the wireless base station is located at the vicinity of the own terminal station, it is necessary to heighten a gain when amplifying a received signal because a received power emitted from the wireless base station becomes small. However, if a reception time and a transmission time are uncertain, the terminal station may receive a signal transmitted by the other terminal station to the wireless base station with large electric power when the terminal station is going to receive a signal from the wireless base station and thus a receiving system may cause a failure (see FIG. 15).

In the case of SOFDMA that is a multiple access scheme that is used for Mobile WiMAX, a subcarrier of OFDM is divided into some groups and a multiple access is realized by assigning the groups to the plurality of terminal stations.

In this case, a plurality of subcarrier groups transmitted from the plurality of terminal stations with maximum power is synthesized and is received by the own terminal station, and thus uplink communication is received with further large electric power.

SUMMARY

According to an aspect of an embodiment of the invention, a mobile terminal station includes a gain setting unit that sets a fixed gain set value that is a predetermined gain value; a received signal amplifying unit that amplifies a received signal received from a base station in accordance with the fixed gain set value set by the gain setting unit; a synchronizing signal detecting unit that detects a synchronizing signal pattern from the received signal amplified by the received signal amplifying unit; and a fixed gain set value control unit that performs an automatic gain control by using the fixed gain set value as an initial value of the automatic gain control when the synchronizing signal pattern is detected by the synchronizing signal detecting unit, and that modifies the fixed gain set value when the synchronizing signal pattern is not detected.

The object and advantages of the embodiment will be realized and attained by means of the elements and combinations particularly pointed out in the claims.

It is to be understood that both the foregoing general description and the following detailed description are exemplary and explanatory and are not restrictive of the embodiment, as claimed.

BRIEF DESCRIPTION OF DRAWINGS

FIG. 8 is a diagram illustrating an example of a table that is held in a gain set value/synchronization detection time holding unit;

FIG. 15 is a diagram explaining the conventional technology.

DESCRIPTION OF EMBODIMENTS

Preferred embodiments of the present invention will be explained with reference to accompanying drawings. The present invention is not limited to the embodiments explained below.

[a] First Embodiment

Hereinafter, it will be sequentially explained about the configuration and process flow of a mobile terminal station according to a first embodiment. Finally, it will be explained about effects caused by the first embodiment. Moreover, the configuration to be explained below can be applied to each method such as FDMA, TDMA, CDMA, and OFDMA as a communication method. Moreover, blocks for spreading/despreading in a CDMA method and for IFFT/FFT in an OFDMA method can be appropriately inserted in accordance with a device configuration.

Configuration of Mobile Terminal Station

Figure 1:
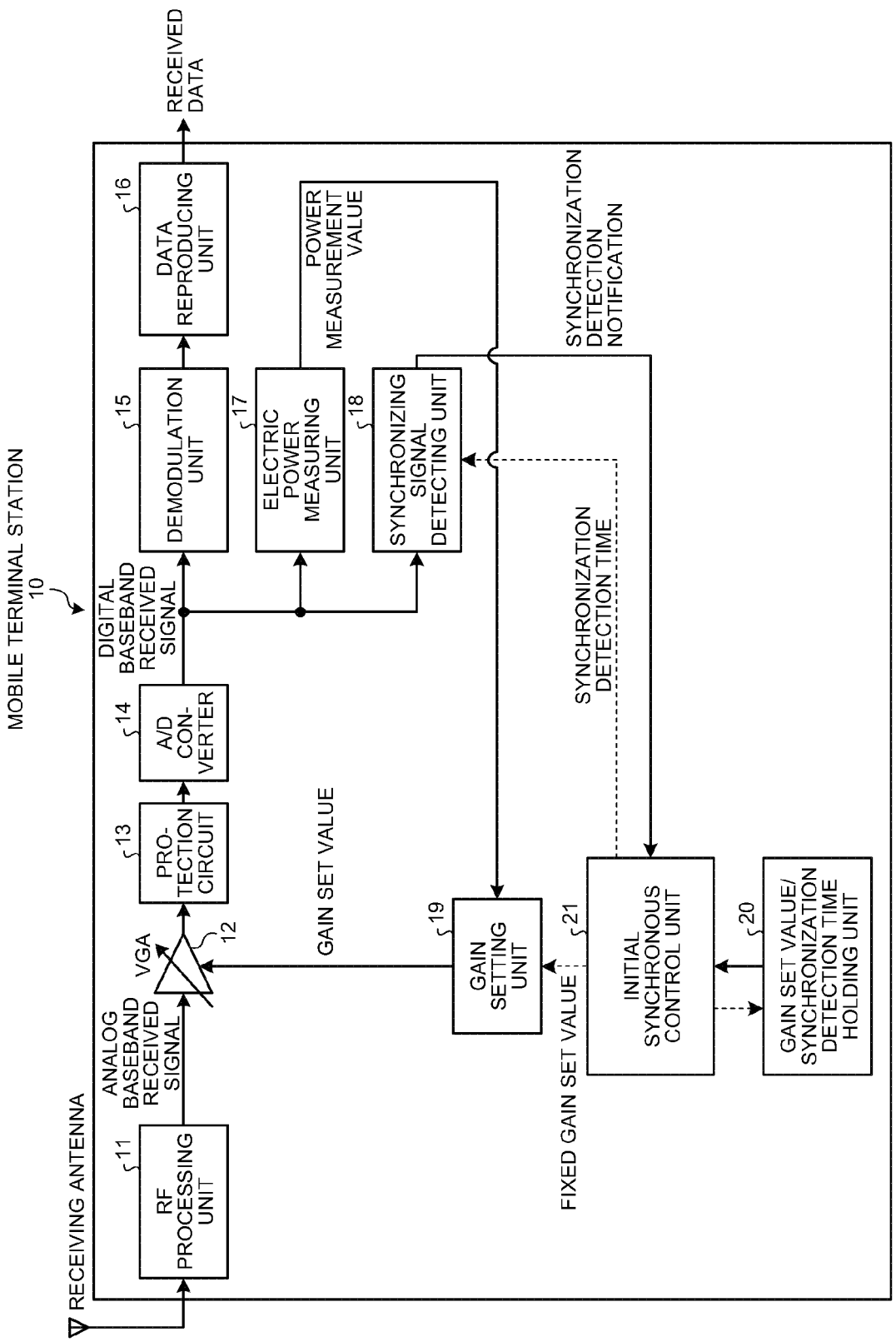
FIG. 1 is a block diagram illustrating the configuration of a mobile terminal station according to a first embodiment.
Figures 2, 3:
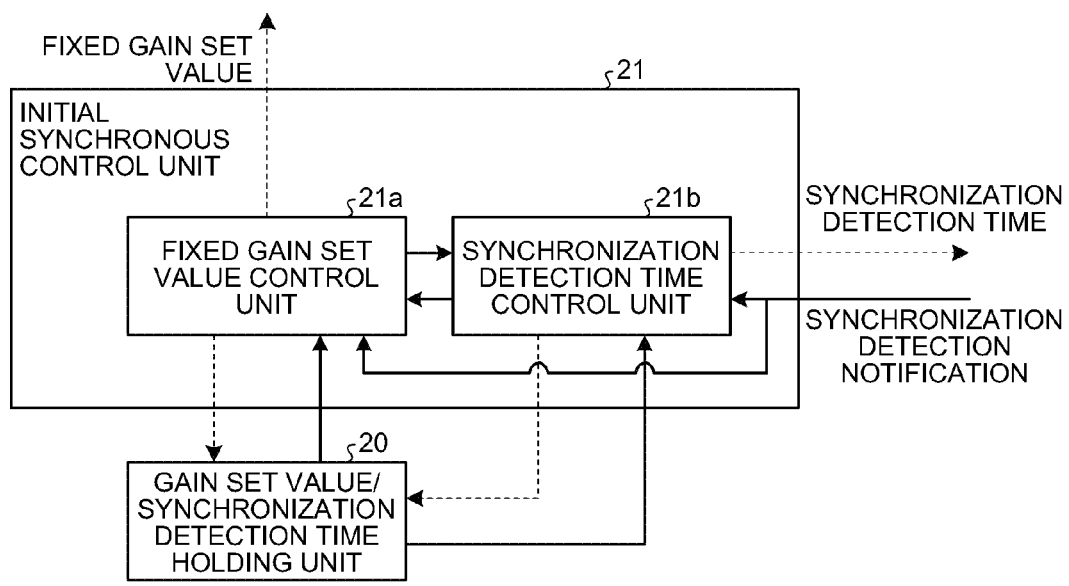
FIG. 2 is a diagram illustrating an example of a table that is held in a gain set value/synchronization detection time holding unit.
FIG. 3 is a block diagram illustrating the configuration of an initial synchronous control unit.
Figure 4:
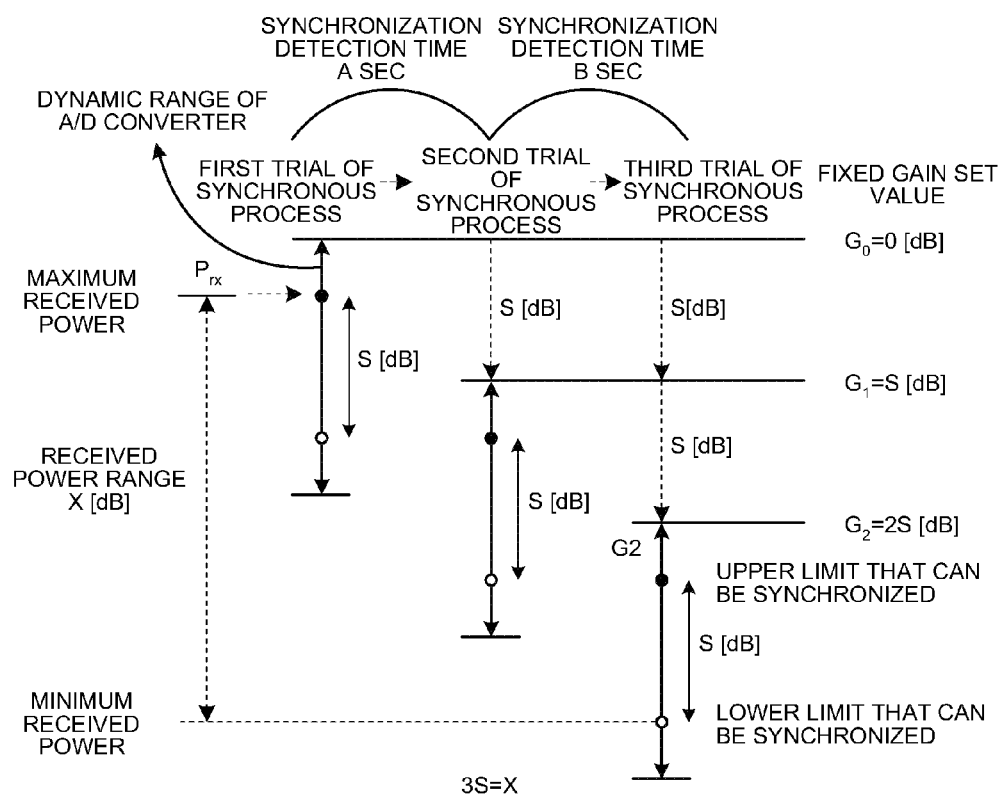
FIG. 4 is a diagram explaining a process for modifying a fixed gain set value.

Next, it will be explained about the configuration of a mobile terminal station 10 with reference to FIG. 1. FIG. 1 is a block diagram illustrating the configuration of the mobile terminal station 10 according to the first embodiment. FIG. 2 is a diagram illustrating an example of a table that is held in a gain set value/synchronization detection time holding unit. FIG. 3 is a block diagram illustrating the configuration of an initial synchronous control unit. FIG. 4 is a diagram explaining a process for modifying a fixed gain set value.

As illustrated in FIG. 1, the mobile terminal station 10 includes an RF processing unit 11, a VGA (variable gain amplifier) 12, a protection circuit 13, an A/D converter 14, a demodulation unit 15, a data reproducing unit 16, an electric power measuring unit 17, a synchronizing signal detecting unit 18, a gain setting unit 19, a gain set value/synchronization detection time holding unit 20, and an initial synchronous control unit 21. It will be below explained about the processes of the units.

The RF processing unit 11 includes a low noise amplifier, a frequency converter, a filter, an orthogonal demodulator, and the like. The RF processing unit 11 converts a signal received by a receiving antenna into an analog baseband received signal and outputs the converted signal to the VGA 12.

The VGA 12 amplifies the received signal received from a wireless base station in accordance with a fixed gain set value set by the gain setting unit 19 described later. Specifically, when receiving the analog baseband received signal from the RF processing unit 11, the VGA 12 amplifies the analog baseband received signal in accordance with the fixed gain set value set by the gain setting unit 19 described later and outputs the amplified signal to the protection circuit 13.

In such a manner that an input signal input into the A/D converter 14 described later does not exceed a predetermined amplitude, the protection circuit 13 performs a clipping process to adapt the received signal to a predetermined specified value and outputs the result to the A/D converter 14 when the analog baseband received signal input from the VGA 12 exceeds the predetermined specified value.

The A/D converter 14 converts the analog baseband received signal input from the protection circuit 13 into a digital baseband received signal, and outputs the digital baseband received signal to the demodulation unit 15, the electric power measuring unit 17, and the synchronizing signal detecting unit 18. In this case, the dynamic range of the digital baseband received signal is restricted by the number of bits of the A/D converter 14.

The demodulation unit 15 performs a demodulation process corresponding to downlink communication on the digital baseband received signal input from the A/D converter 14 and outputs the result to the data reproducing unit 16.

The data reproducing unit 16 performs a decoding process corresponding to downlink communication on the digital baseband received signal demodulated by the demodulation unit 15 and outputs the decoded received data.

The electric power measuring unit 17 measures the electric power of the digital baseband received signal input from the A/D converter 14 and outputs the measured electric power value to the gain setting unit 19.

The synchronizing signal detecting unit 18 detects a synchronizing signal pattern from the amplified received signal. Specifically, the synchronizing signal detecting unit 18 detects a downlink synchronizing signal from the digital baseband received signal input by the A/D converter 14 to establish timing synchronization and frequency synchronization within a synchronous processing time of the initial synchronous control unit 21. Then, when the synchronizing signal pattern is successfully detected, the synchronizing signal detecting unit 18 informs the initial synchronous control unit 21 of that result.

For example, as an example of a detection process of a synchronizing signal pattern, a Preamble signal inserted into the first symbol of a wireless frame is used in the case of a Mobile WiMAX standard. As the detection of a synchronizing signal pattern, the synchronizing signal detecting unit 18 performs the detection of a Frame symbol timing performed by a time correlation computation in a time domain and the matching of a Preamble pattern for each subcarrier in a frequency domain after executing an FFT process in combination with each other. As a result, even if a received signal having an extremely large electric power exists during uplink communication time, synchronous pattern detection succeeds only in the case of the gain setting in which a downlink signal enters in a dynamic range by using a correlation operation and a pattern matching.

The gain setting unit 19 sets the fixed gain set value that is a predetermined gain value at initial synchronization. Specifically, when an initial synchronization process is started, the gain setting unit 19 sets, in the VGA 12, a fixed gain set value reported from the initial synchronous control unit 21 instead of a gain set value based on a normal power measurement value. The fixed gain set value is a fixed gain value that is selected by the initial synchronous control unit 21 described later from fixed gain values that are held in the gain set value/synchronization detection time holding unit 20. For example, a minimum gain value is set as a fixed gain value that is first selected.

Moreover, the gain setting unit 19 performs gain setting on the VGA 12 in such a manner that a receiving level is adjusted into the input range of the A/D converter 14 on the basis of the power measurement value measured by the electric power measuring unit 17 during normal communication.

The gain set value/synchronization detection time holding unit 20 holds the fixed gain set value that is a predetermined gain value at initial synchronization and the synchronization detection time in association with each other. Specifically, as illustrated in FIG. 2, the gain set value/synchronization detection time holding unit 20 holds a table that stores the fixed gain set value and the synchronization detection time in association with each other and the initial synchronous control unit 21 described later reads out the fixed gain set value and the synchronization detection time.

Moreover, the gain set value/synchronization detection time holding unit 20 previously stores, for example, values, between which each difference (S[dB] in FIG. 2) is a gain that is obtained by dividing a required received power range by the number of settings (three times in an example of FIG. 2), as fixed gain set values.

Moreover, the gain set value/synchronization detection time holding unit 20 previously stores, for example, a time, which is obtained by dividing a time period permitted in an initial synchronization process by the number of settings (three times in an example of FIG. 2), as a synchronization detection time. The synchronization detection time held in the gain set value/synchronization detection time holding unit 20 is updated in accordance with a time for the detection of a synchronizing signal pattern performed by the initial synchronous control unit 21 described later and a detection probability of the synchronizing signal pattern.

The initial synchronous control unit 21 controls an operation of each unit on the initial synchronization and further inputs a fixed gain set value, synchronization detection information, position information, and moving speed information. Particularly, as illustrated in FIG. 3, the initial synchronous control unit 21 includes a fixed gain set value control unit 21a and a synchronization detection time control unit 21b.

When the synchronizing signal pattern is successfully detected, the fixed gain set value control unit 21a controls to perform an automatic gain control (AGC) by using the fixed gain set value as the initial value of the automatic gain control. Moreover, when the detection of the synchronizing signal pattern is a failure, the fixed gain set value control unit 21a controls to modify the fixed gain set value to another fixed gain set value.

Specifically, the fixed gain set value control unit 21a reads out a fixed gain set value from the gain set value/synchronization detection time holding unit 20 at the initial synchronization and informs the gain setting unit 19 of the read fixed gain set value. For example, the fixed gain set value control unit 21a reads out a minimum gain value ($G_0$=0 [dB] in an example of FIG. 2) as a fixed gain value that is first read and informs the gain setting unit 19 of the read value.

Then, assuming that the detection of the synchronizing signal pattern is a failure when the notification that the synchronizing signal pattern is successfully detected from the synchronizing signal detecting unit 18 in the synchronous processing time set in the synchronization detection time control unit 21b is not received, the fixed gain set value control unit 21a modifies the fixed gain set value and re-executes the synchronization detection process.

Moreover, assuming that the detection of the synchronizing signal pattern is a success when the notification that the synchronizing signal pattern is successfully detected from the synchronizing signal detecting unit 18 in the synchronous processing time set by the synchronization detection time control unit 21b is received, the fixed gain set value control unit 21a performs an automatic gain control (AGC) to start communication by using the fixed gain set value as the initial value of the automatic gain control.

Now, it is explained about a process for modifying a fixed gain set value with reference to FIG. 4. In an example of FIG. 4, there is illustrated the case where the entire (received power range X [dB] in an example of FIG. 4) of a required received power range can be included in the synchronous range (3S [dB] in an example of FIG. 4) of the A/D converter 14 by three-time fixed gain set values. In this case, a synchronous range means a range, in which synchronization is successfully performed, within the dynamic range of the A/D converter 14.

First, the mobile terminal station 10 sets a minimum fixed gain set value as an initial gain and performs a synchronous pattern detection process. Then, when the process fails, the mobile terminal station 10 increases the fixed gain set value by S [dB] and similarly performs the synchronizing signal pattern detection. When the synchronizing signal falls in the synchronous range of the A/D converter 14 and thus the synchronous process succeeds by repeating this process, the mobile terminal station 10 uses a fixed gain set value at success as an initial gain value for a normal AGC control.

After that, the mobile terminal station 10 can recognize a frame timing and can measure an electric power by using only a signal transmitted by a wireless base station, after the synchronous process succeeds. Moreover, when a time-out time set in the whole time period of the initial synchronization process is detected, the mobile terminal station 10 performs a time-out process such as a retry, a notification to a high-order layer, and a switching to another frequency.

In other words, the mobile terminal station 10 can set an AGC initial gain in the incoming power range of the signal transmitted from the base station without measuring an electric power and can realize the initial synchronization process by using the previously-held fixed gain set value even if another terminal station during communication exists in the vicinity.

Returning to the explanation of FIG. 1, the synchronization detection time control unit 21b sets a synchronization detection time that is a time period for detecting a synchronizing signal for each fixed gain set value in accordance with a time for the detection of the synchronizing signal pattern and a detection probability of the synchronizing signal pattern.

Specifically, the synchronization detection time control unit 21b reads out a synchronous processing time corresponding to the fixed gain set value set by the fixed gain set value control unit 21a from the gain set value/synchronization detection time holding unit 20 at the time of initial synchronization, and sets the synchronous processing time as a time-out value and informs the synchronizing signal detecting unit 18 of the synchronous processing time.

Then, the synchronization detection time control unit 21b computes a time for the detection of the synchronizing signal pattern and a detection probability of the synchronizing signal pattern for each fixed gain set value from the notification that the synchronizing signal pattern reported from the synchronizing signal detecting unit 18 is successfully detected.

The synchronization detection time control unit 21b updates the synchronization detection time of the gain set value/synchronization detection time holding unit 20 in accordance with the time for the detection of the synchronizing signal pattern and the detection probability of the synchronizing signal pattern that are computed.

In other words, a time required for the synchronization is different depending on a received power, SNR, and a range in which synchronization detection succeeds within the dynamic range of the A/D converter. For example, because a time required for synchronization is short when a received power is high or when SNR is high, the synchronization detection time of the gain set value/synchronization detection time holding unit 20 may be updated to shorten the synchronization detection time.

Moreover, because a margin for the level fluctuation of a received signal becomes small and signal erasure and clipping occur and thus a required time for synchronization detection gets longer when the dynamic range of the A/D converter is further widely used, the synchronization detection time may be updated to lengthen the time. In this way, while updating a synchronization detection time to optimize a synchronization detection probability, an initial synchronous processing time can be shortened.

Process by Mobile Terminal Station

Figure 5:
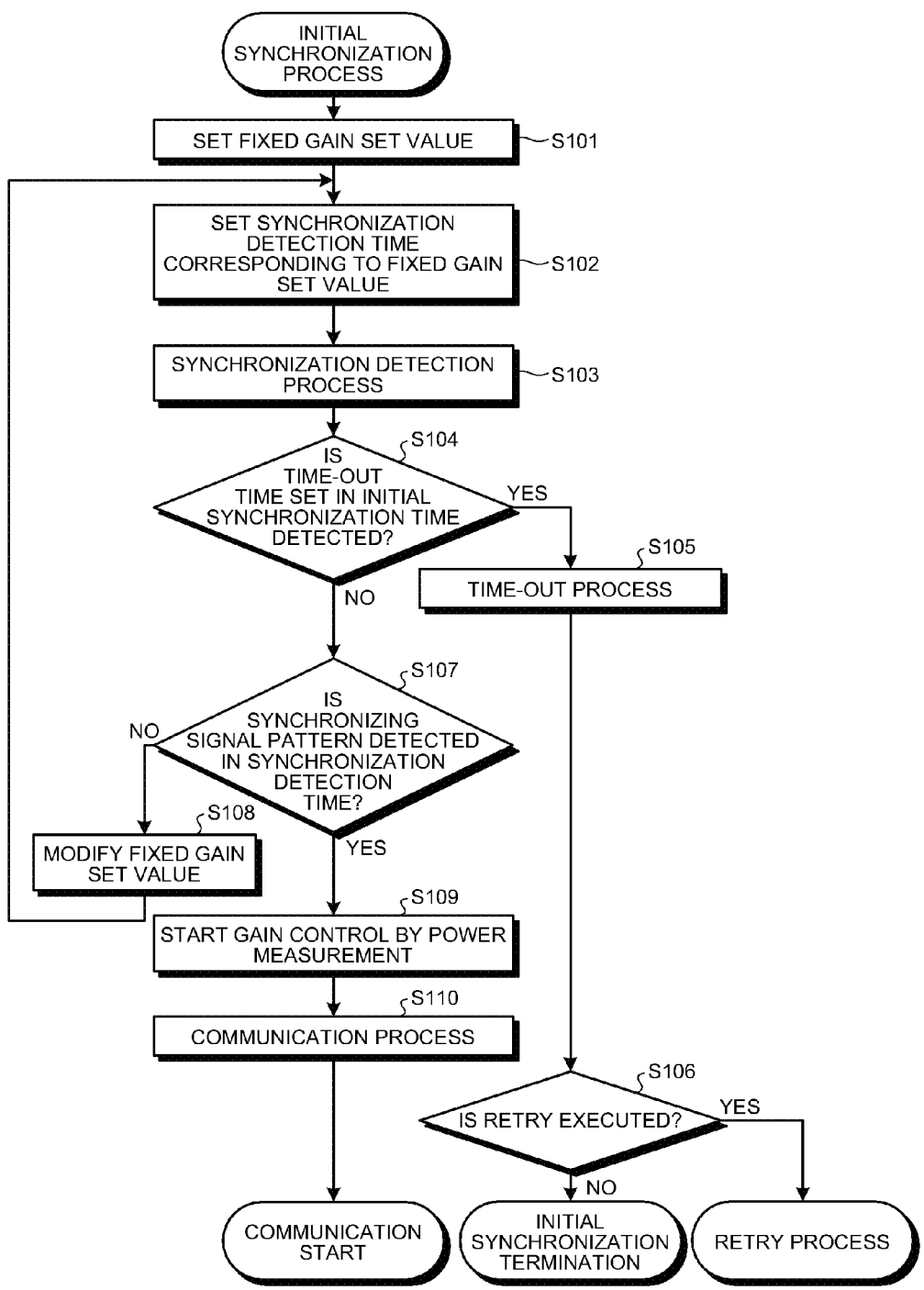
FIG. 5 is a flowchart illustrating process operations of the mobile terminal station according to the first embodiment.

Next, it will be explained about a process that is performed by the mobile terminal station 10 according to the first embodiment with reference to FIG. 5. FIG. 5 is a flowchart illustrating process operations of the mobile terminal station 10 according to the first embodiment.

As illustrated in FIG. 5, the mobile terminal station 10 sets a fixed gain set value that is a predetermined gain value at initial synchronization (Step S101). Then, the mobile terminal station 10 reads out a synchronous processing time corresponding to the set fixed gain set value from the gain set value/synchronization detection time holding unit 20 and sets the synchronous processing time as a time-out time (Step S102).

Next, the mobile terminal station 10 detects a downlink synchronizing signal from the received signal output from the A/D converter 14 (Step S103). After that, the mobile terminal station 10 determines whether the time-out time set in an initial synchronization time is detected (Step S104). As a result, when the time-out time is detected (Step S104: YES), the mobile terminal station 10 performs a time-out process such as the switching to another frequency (Step S105) and then determines whether a retry is executed (Step S106).

As a result, when the retry is executed (Step S106: YES), the mobile terminal station 10 performs a retry process. On the other hand, when the retry is not executed (Step S106: NO), the mobile terminal station 10 terminates the initial synchronization process.

Moreover, when the time-out time is not detected (Step S104: NO), the mobile terminal station 10 determines whether the synchronizing signal pattern is detected in the set synchronous processing time (Step S107). As a result, when the synchronizing signal pattern is not detected in the set synchronous processing time (Step S107: NO), the mobile terminal station 10 modifies the fixed gain set value (Step S108) and re-executes the synchronization detection process (Steps S102 to S107).

Then, when the synchronizing signal pattern is detected in the set synchronous processing time (Step S107: YES), the mobile terminal station 10 starts an automatic gain control by using the fixed gain set value as the initial value of the automatic gain control (Step S109) and performs communication (Step S110).

Effect of First Embodiment

As described above, the mobile terminal station 10 sets a fixed gain set value that is a predetermined gain value at initial synchronization and amplifies a received signal received from a base station in accordance with the set fixed gain set value. Then, the mobile terminal station 10 detects a synchronizing signal pattern from the amplified received signal, and controls to perform an automatic gain control by using the fixed gain set value as the initial value of the automatic gain control when the detection of the synchronizing signal pattern is a success and modifies the fixed gain set value when the detection of a synchronizing signal pattern is a failure. For this reason, the mobile terminal station 10 can set an AGC initial gain in the incoming power range of a signal transmitted from the base station without measuring an electric power and can perform an initial synchronization process by using a previously-held fixed gain set value even if another terminal station during communication exists in the vicinity.

Moreover, according to the first embodiment, the mobile terminal station 10 sets a synchronization detection time that is a time period for detecting a synchronizing signal for each fixed gain set value in accordance with a time for the detection of the synchronizing signal pattern and a detection probability of the synchronizing signal pattern. Then, when the detection of the synchronizing signal pattern is a failure in the set synchronous processing time, the mobile terminal station 10 controls to modify the fixed gain set value. For this reason, while updating a synchronization detection time to optimize a synchronization detection probability, an initial synchronous processing time can be shortened.

[b] Second Embodiment

However, the mobile terminal station may modify a fixed gain set value and a synchronization detection time in accordance with information on the moving state of an own terminal station and the distribution of the received powers at the position of the own terminal station.

Figure 6:
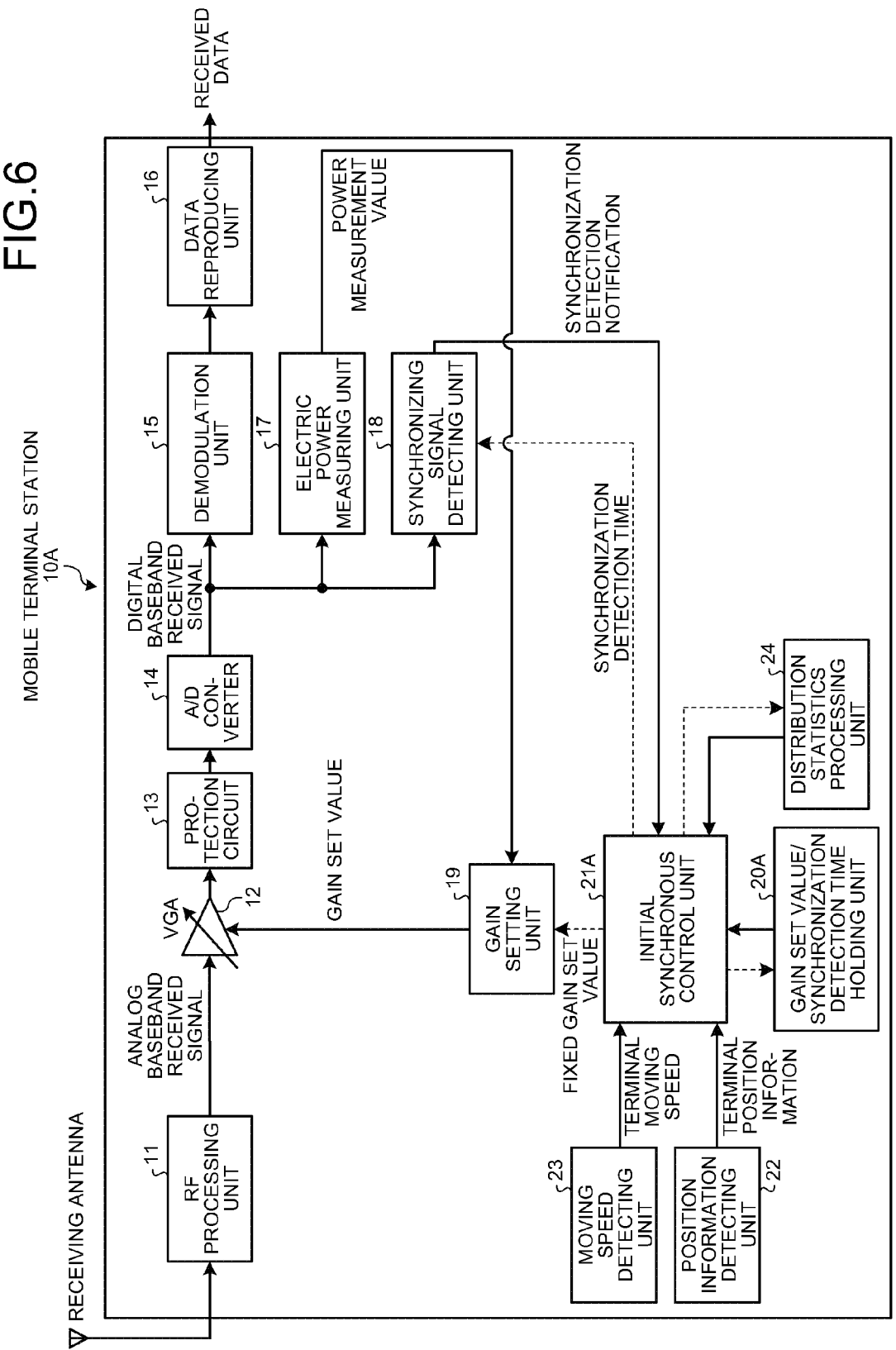
FIG. 6 is a block diagram illustrating the configuration of a mobile terminal station according to a second embodiment.
Figure 7:
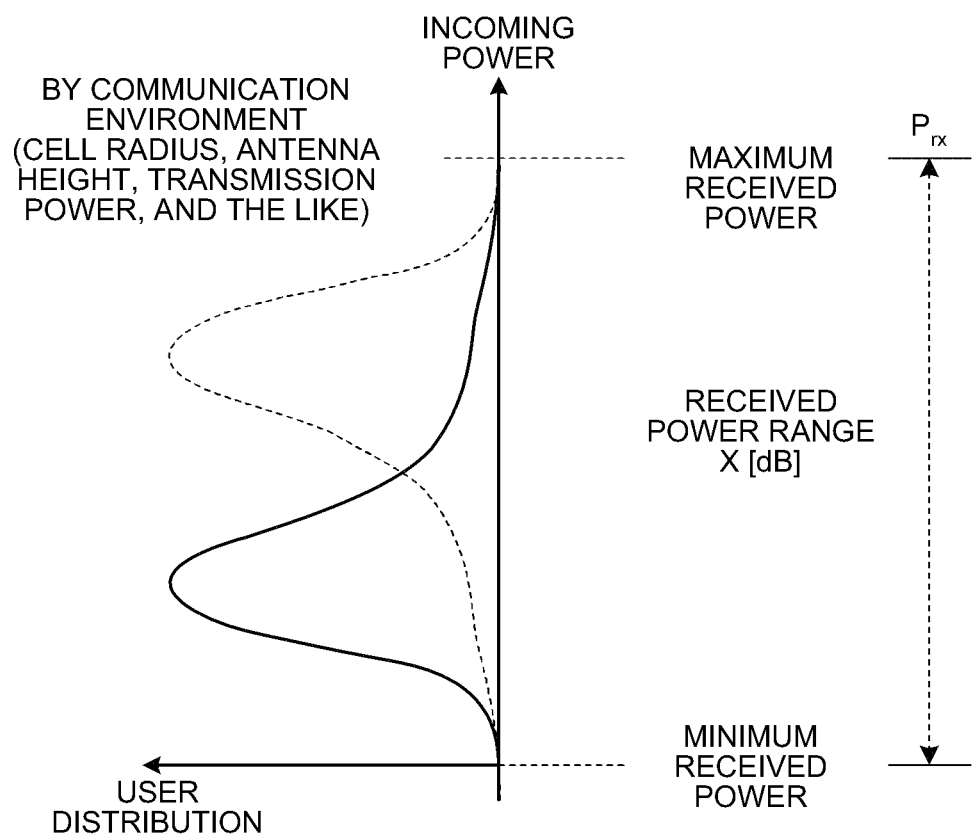
FIG. 7 is a diagram explaining the distribution of received powers.
Figure 9:
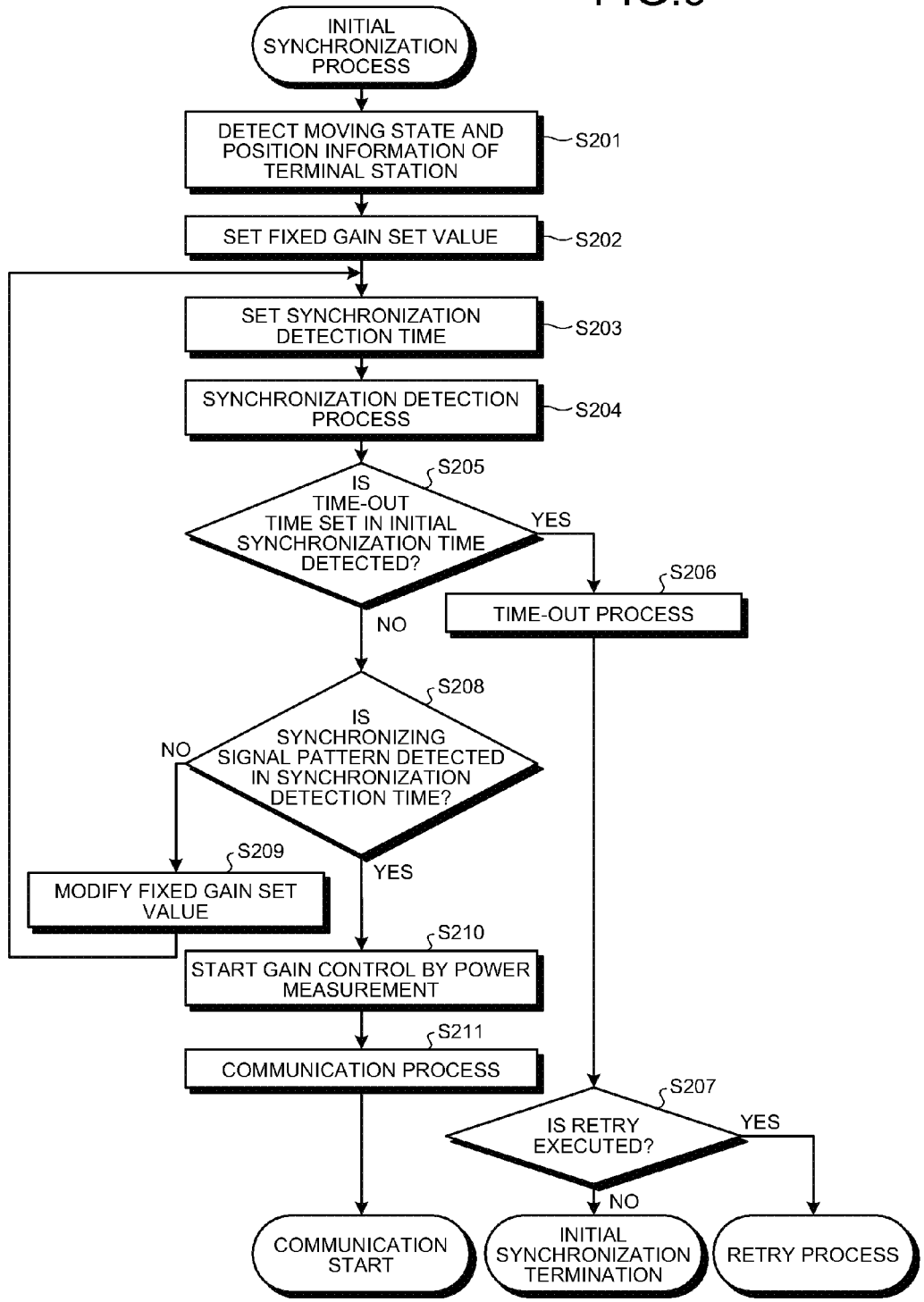
FIG. 9 is a flowchart illustrating process operations of the mobile terminal station according to the second embodiment.

Therefore, in the following second embodiment, as the case where a fixed gain set value and a synchronization detection time are modified in accordance with information on the moving state of an own terminal station and the distribution of the received powers at the position of the own terminal station, it will be explained about the configuration and process of a mobile terminal station 10A according to the second embodiment with reference to FIGS. 6 to 9. FIG. 6 is a block diagram illustrating the configuration of the mobile terminal station 10A according to the second embodiment. FIG. 7 is a diagram illustrating the distribution of received powers. FIG. 8 is a diagram illustrating an example of a table that is held in a gain set value/synchronization detection time holding unit. FIG. 9 is a flowchart illustrating process operations of the mobile terminal station 10A according to the second embodiment.

As illustrated in FIG. 6, the mobile terminal station 10A further includes a position information detecting unit 22, a moving speed detecting unit 23, and a distribution statistics processing unit 24 as a different point as compared to the mobile terminal station 10 illustrated in FIG. 1. It will be below explained about a process of each unit.

The position information detecting unit 22 detects the current position of the own mobile terminal station. Specifically, the position information detecting unit 22 regularly detects the current position of the own mobile terminal station and outputs the current position to an initial synchronous control unit 21A. As a method for detecting a current position, there is, for example, a method for using a system such as GPS.

The moving speed detecting unit 23 detects information on the moving state of the own terminal station. Specifically, the moving speed detecting unit 23 regularly detects the moving speed of the own terminal station and outputs the moving speed to the initial synchronous control unit 21A. As a method for detecting a moving speed, there are, for example, a method for detecting the displacement of position information, a method for acquiring information from a speed sensor of a mobile object when it is mounted on a car, a method for detecting the Doppler variation of a received signal, and the like.

The distribution statistics processing unit 24 performs statistical processing on the fixed gain set values, the synchronization detection times, the position information of the own terminal station when the synchronizing signal pattern is successfully detected in order to create the distribution of received powers.

Specifically, the distribution statistics processing unit 24 acquires the fixed gain value, the synchronization detection time, and the position information, when synchronization detection is a success in an initial synchronization process, from the initial synchronous control unit 21A, creates the distribution of the received powers by performing statistical processing, and informs the initial synchronous control unit 21A of the result. The initial synchronous control unit 21A described later makes a gain set value/synchronization detection time holding unit 20A store the fixed gain set value and the synchronization detection time in accordance with the created distribution of the received powers.

Now, it is specifically explained about the distribution of received powers with reference to FIG. 7. FIG. 7 illustrates an example of a user distribution for received powers corresponding to a received power range. As illustrated in FIG. 7, generally, users are not uniformly distributed in a prescribed received power. The received power range has a received power range having a high probability and a received power range having a low probability.

The distribution is different in accordance with various factors such as cell radius, antenna height, transmission power, cell installation environment, and time zone depending on mobile communication systems. In FIG. 7, a solid-line distribution is a distribution example of a system that has a comparatively wide cell radius. In this case, a ratio of a user that has an extremely high received power in the vicinity of the base station becomes small.

On the other hand, a dotted-line distribution is a distribution example of a system that has a comparatively narrow cell radius such as a hot spot. The received power of a signal received from the base station by the terminal station that performs the initial synchronization process becomes close to the distribution inside the cell on an average. The initial synchronous control unit 21A described later decides a fixed gain value that is set in consideration of the distribution at the initial synchronization and a synchronous pattern detection waiting time The gain set value/synchronization detection time holding unit 20A holds fixed gain set values and synchronization detection times in association with each other, in addition to position information. Specifically, as illustrated in FIG. 8, the gain set value/synchronization detection time holding unit 20A stores appropriate fixed gain set values and synchronization detection times according to the distribution of received powers at the position in addition to each position information (for example, a spot, b spot, and c spot).

Similarly to the initial synchronous control unit 21 according to the first embodiment, the initial synchronous control unit 21A includes the fixed gain set value control unit 21a and the synchronization detection time control unit 21b. The fixed gain set value control unit 21a sets a fixed gain set value in accordance with the created distribution of the received powers. Specifically, the fixed gain set value control unit 21a makes the gain set value/synchronization detection time holding unit 20A store a fixed gain set value corresponding to the current position information in accordance with the distribution of received powers reported from the distribution statistics processing unit 24.

Moreover, the fixed gain set value control unit 21a reads out the fixed gain set value corresponding to the current position information input from the position information detecting unit 22 from the gain set value/synchronization detection time holding unit 20 at the time of initial synchronization. Then, the fixed gain set value control unit 21a informs the gain setting unit 19 of the read fixed gain set value. For example, when the current position is "a spot", the fixed gain set value control unit 21a read outs a minimum gain value ($G_0=0$ [dB] in an example of FIG. 8) in the table corresponding to the "a spot" as a fixed gain value that is first read, and informs the gain setting unit 19 of the fixed gain set value.

Similarly to the first embodiment, assuming that the detection of the synchronizing signal pattern is a failure when the notification that the synchronizing signal pattern is successfully detected from the synchronizing signal detecting unit 18 in the synchronous processing time set in the synchronization detection time control unit 21b is not received, the fixed gain set value control unit 21a modifies the fixed gain set value and re-executes the synchronization detection process.

Moreover, similarly to the first embodiment, assuming that the detection of the synchronizing signal pattern is a success when the notification that the synchronizing signal pattern is successfully detected from the synchronizing signal detecting unit 18 in the synchronous processing time set by the synchronization detection time control unit 21b is received, the fixed gain set value control unit 21a performs an automatic gain control (AGO) by using the fixed gain set value as the initial value of the automatic gain control to start communication.

The synchronization detection time control unit 21b sets a synchronization detection time in accordance with the created distribution of received powers and the terminal moving speed. Specifically, the synchronization detection time control unit 21b decides a synchronization detection time corresponding to the current position information and makes the gain set value/synchronization detection time holding unit 20A store the synchronization detection time, in accordance with the distribution of received powers reported from the distribution statistics processing unit 24 and the moving speed of the own terminal input from the moving speed detecting unit 23.

Moreover, similarly to the first embodiment, the synchronization detection time control unit 21b reads out the synchronous processing time corresponding to the fixed gain set value set by the fixed gain set value control unit 21a from the gain set value/synchronization detection time holding unit 20, sets the synchronous processing time as a time-out value, and informs the synchronizing signal detecting unit 18 of the synchronous processing time, at the time of initial synchronization.

Moreover, the fixed gain set value and the synchronization detection time are different depending on a moving speed, terminal position information, and the presence or absence of the initial synchronization process at the past same position. For example, because the synchronization establishment of the wide dynamic range can be performed at a short time when the moving speed of a terminal is close to a stationary state, the change step of a fixed gain set value can be largely set or the synchronization detection time can be shortly set and thus a process for the whole of the required received power range can be shortened. On the other hand, when the moving speed of the terminal is a high speed, a fixed gain set value and a synchronization detection time may be set so that a synchronizing signal is surely performed.

Moreover, with the emphasis on shortening a time required for average synchronization establishment, optimization can be performed in such a manner that the process is stopped, for example, at a synchronization detection time at which synchronization probability is 80% and the modification is performed to the next fixed gain set value.

Next, it will be explained about a process of the mobile terminal station 10A according to the second embodiment. The process of the mobile terminal station 10A of the second embodiment includes newly detecting the moving state and position information of an own terminal station as a different point as compared to the process of the mobile terminal station 10 according to the first embodiment illustrated in FIG. 5.

In other words, as illustrated in FIG. 9, the mobile terminal station 10A detects the moving state and position information of an own terminal station (Step S201) and sets a fixed gain set value in accordance with the distribution of received powers corresponding to the detected position information (Step S202).

Then, the mobile terminal station 10A sets a synchronization detection time in accordance with the detected moving state and the distribution of received powers corresponding to the detected position information (Step S203). The following processes (Step S204 to S211) are similar to those of the first embodiment.

In this way, according to the second embodiment, the mobile terminal station 10A detects information on the moving state of the own terminal station, and sets a synchronization detection time that is a time period for detecting a synchronizing signal for each fixed gain set value in accordance with the detected information on the moving state. Then, when the detection of the synchronizing signal pattern is a failure in the set synchronous processing time, the mobile terminal station 10A controls to modify the fixed gain set value. For this reason, an optimum synchronization detection time can be set for the moving state of the terminal station and thus the required time of the initial synchronization process can be shortened.

Moreover, the mobile terminal station 10A controls to set the fixed gain set value in accordance with the distribution of received powers at the position of the own terminal station and sets the synchronization detection time in accordance with the distribution of received powers. For this reason, the initial synchronization process can be performed in consideration of an incoming power range having a high distribution probability and thus a probability by which the initial synchronization process is completed at a short time can be raised.

Moreover, the mobile terminal station 10A performs statistical processing on the fixed gain set values, the synchronization detection times, the position information of the own terminal station when the synchronizing signal pattern is successfully detected, creates the distribution of received powers, and controls to set the fixed gain set value in accordance with the created distribution of received powers.

Then, the mobile terminal station 10A sets the synchronization detection time in accordance with the created distribution of received powers. For this reason, the initial synchronization process can be performed in consideration of the distribution of received powers and thus the initial synchronization process can be speeded up.

[c] Third Embodiment

In the second embodiment, the mobile terminal station 10A creates the distribution of received powers. However, the present invention is not limited to this. The mobile terminal station 10A may receive information on the distribution of received powers from a base station.

Figure 10:
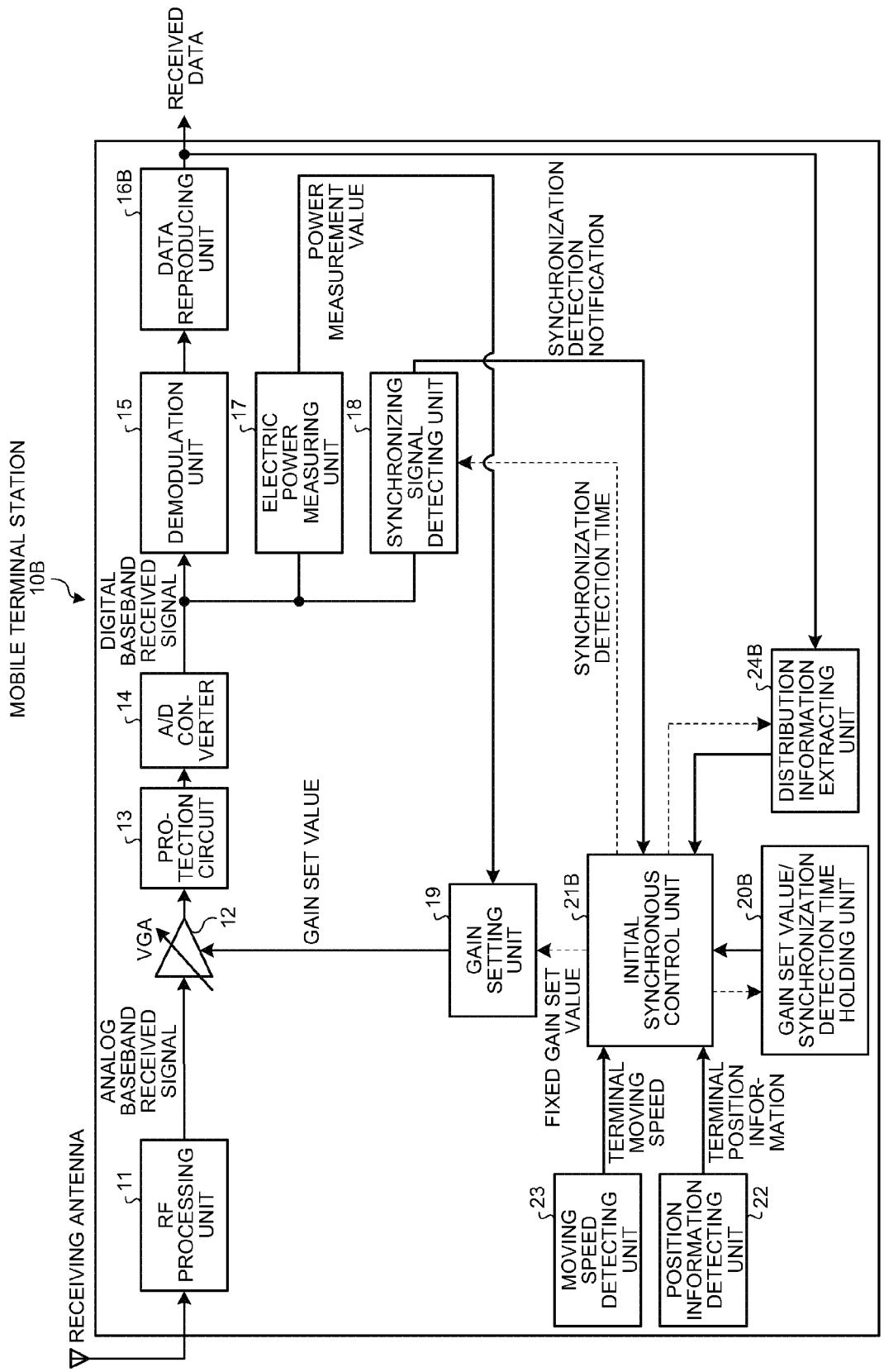
FIG. 10 is a block diagram illustrating the configuration of a mobile terminal station according to a third embodiment.
Figure 11:
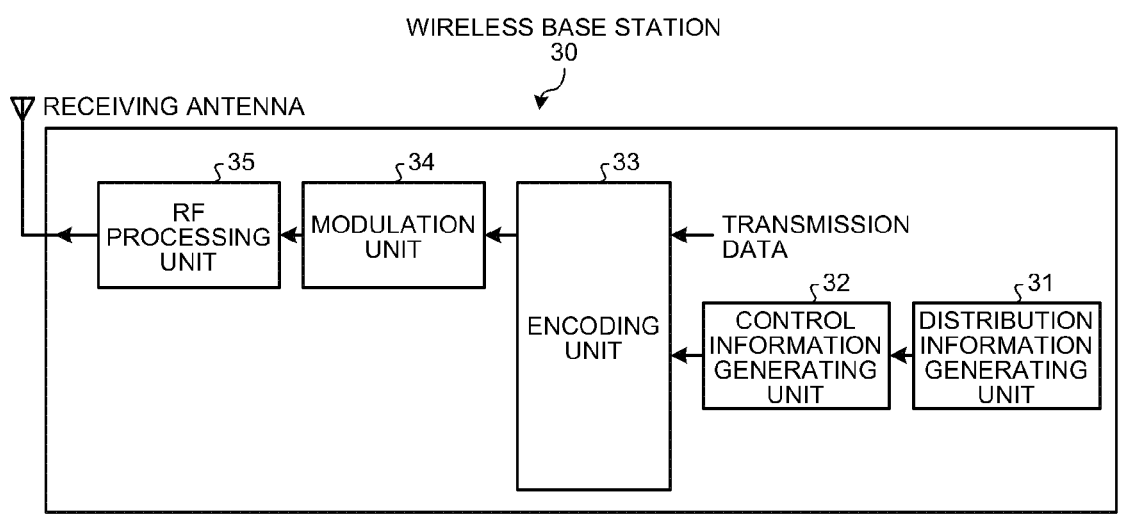
FIG. 11 is a block diagram illustrating the configuration of a wireless base station according to the third embodiment.

Therefore, in a third embodiment, as the case where information on the distribution of received powers is received from the base station as broadcast information, it will be explained about the configuration of a mobile terminal station 10B and a wireless base station 30 according to the third embodiment with reference to FIGS. 10 and 11. FIG. 10 is a block diagram illustrating the configuration of the mobile terminal station 10B according to the third embodiment. FIG. 11 is a block diagram illustrating the configuration of the wireless base station 30 according to the third embodiment.

As illustrated in FIG. 10, the mobile terminal station 10B includes a distribution information extracting unit 24B instead of the distribution statistics processing unit 24 as a different point as compared to the mobile terminal station 10A illustrated in FIG. 6. It will be below explained about a process of each unit.

The distribution information extracting unit 24B extracts information on the distribution of received powers from a received signal. Specifically, the distribution information extracting unit 24B receives received data from a data reproducing unit 16B, extracts the reception distribution information of a cell from the received data, and informs an initial synchronous control unit 21B of the extracted information.

Similarly to the second embodiment, the initial synchronous control unit 21B makes a gain set value/synchronization detection time holding unit 20B store the fixed gain set value corresponding to the current position information in accordance with the distribution of received powers reported from the distribution statistics processing unit 24.

Next, it is explained about the configuration of the wireless base station 30 according to the third embodiment with reference to FIG. 11. As illustrated in FIG. 11, the wireless base station 30 includes a distribution information generating unit 31, a control information generating unit 32, an encoding unit 33, a modulation unit 34, and an RF processing unit 35. It will be below explained about a process of each unit. Moreover, in FIG. 11, only elements relevant to the transmission of the distribution information of received powers according to the present invention are illustrated.

The distribution information generating unit 31 creates the received power distribution information of a cell, which is assumed from characteristics such as environment, antenna height, and transmission power, provided in an own wireless base station, and inputs the distribution information into the control information generating unit 32.

The control information generating unit 32 generates broadcast information including the received power distribution information reported to the mobile terminal station 10B along with other communication parameters and inputs the broadcast information into the encoding unit 33. The encoding unit 33 encodes user data and control information and inputs the result into the modulation unit 34.

The modulation unit 34 modulates the data encoded by the designated modulation method. The RF processing unit 35 up-converts the modulated digital baseband signal into an RF frequency and transmits the result via a transmitting antenna.

As described above, according to the third embodiment, the mobile terminal station 10B extracts the information on the distribution of received powers from the received signal transmitted by the wireless base station 30, and controls to set the fixed gain set value in accordance with the extracted distribution of received powers. Then, the mobile terminal station 10B sets the synchronization detection time in accordance with the extracted distribution of received powers. As a result, the initial synchronization process can perform in consideration of the distribution of received powers and thus the initial synchronization process can be speeded up.

[d] Fourth Embodiment

It has been explained about the embodiments of the present invention above. The present invention may be realized by various different configurations in addition to the embodiments described above. Therefore, it will be below explained about another embodiment included in the present invention as a fourth embodiment.

(1) System Configuration

Each component of each device illustrated in the drawings is a functional concept. Therefore, these components are not necessarily constituted physically as illustrated in the drawings. In other words, the specific configuration of dispersion/integration of each device is not limited to the illustrated configuration. Therefore, all or a part of each device can be dispersed or integrated functionally or physically in an optional unit in accordance with various types of loads or operating conditions. For example, the fixed gain set value control unit 21a and the synchronization detection time control unit 21b may be integrated. Furthermore, all or a part of each process function performed by each device can be realized by CPU and a program that is analyzed and executed by the CPU or can be realized by a hardware by wired logic.

Moreover, among the processes described in the present embodiments, the whole or a part of processes that have been automatically performed can be manually performed. Alternatively, the whole or a part of processes that have been manually performed can be automatically performed in a well-known method. Also, processing procedures, control procedures, concrete titles, and information including various types of data and parameters, which are described in the document and the drawings, can be arbitrarily changed except that they are specially mentioned. For example, a fixed gain set value and a synchronization detection time may be arbitrarily modified.

(2) Program

Figure 12:
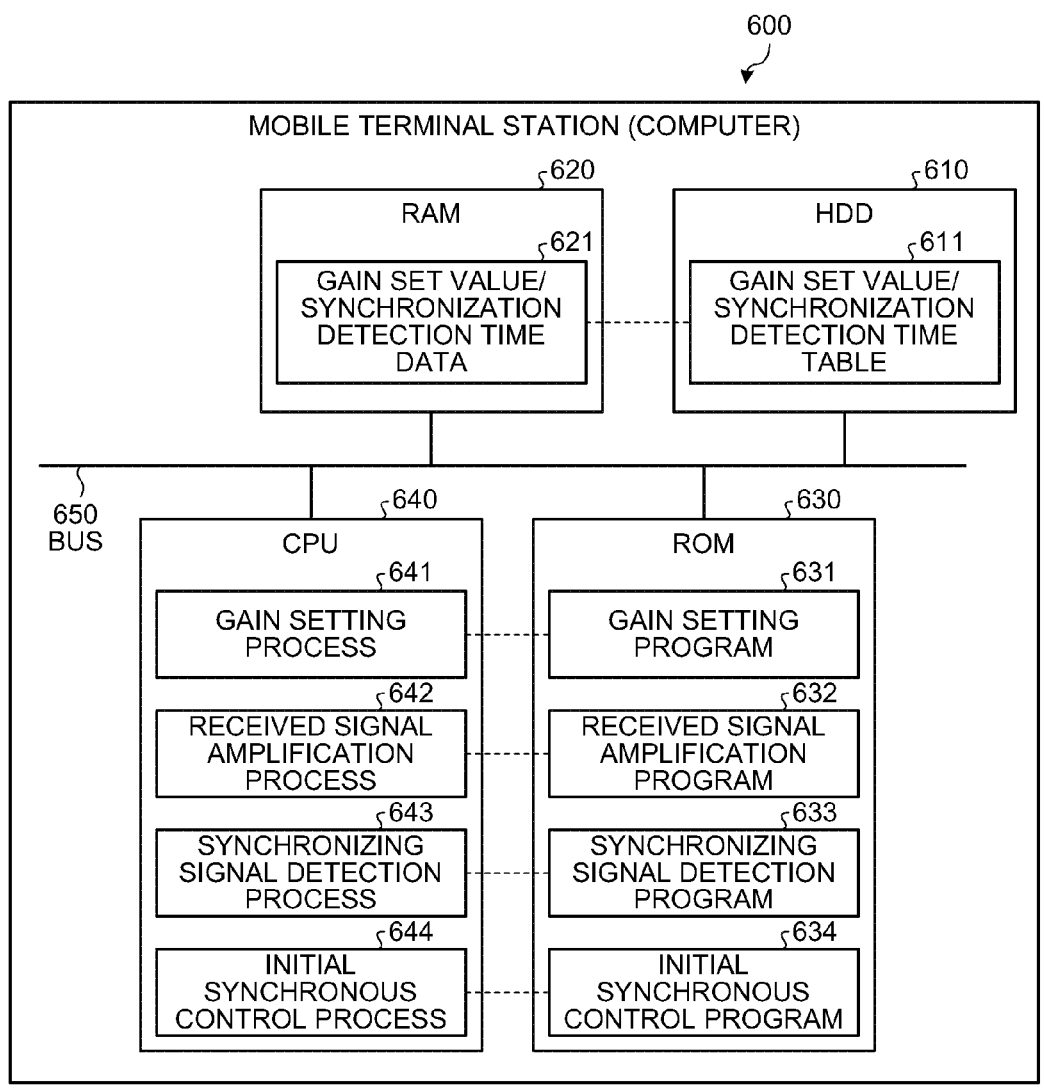
FIG. 12 is a diagram illustrating a computer that executes a synchronous control program.
Figure 13:
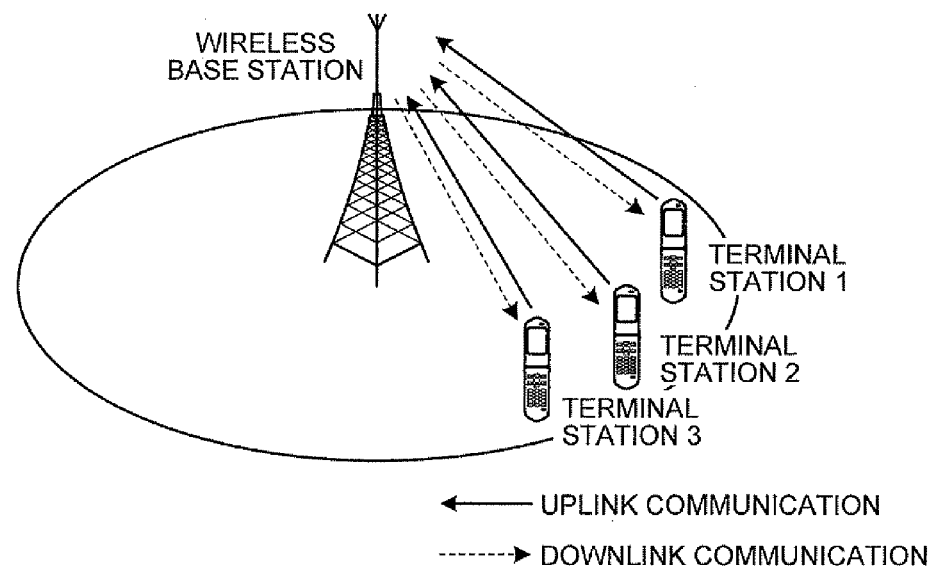
FIG. 13 is a diagram explaining a conventional technology.
Figure 14:
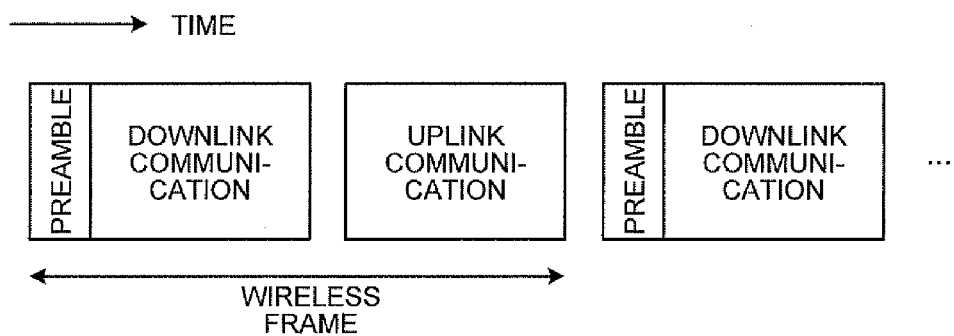
FIG. 14 is a diagram explaining the conventional technology.

However, various types of processes explained in the embodiment can be realized by executing a previously-prepared program by using a computer. Therefore, it will be below explained about an example of a computer that executes a program having the same function as that of the embodiment with reference to FIG. 12. FIG. 12 is a diagram illustrating a computer 600 that executes a synchronous control program.

As illustrated in FIG. 12, the computer 600 that functions as a mobile terminal station includes an HDD 610, a RAM 620, a ROM 630, and a CPU 640 that are connected by a bus 650.

Then, the ROM 630 previously stores therein a synchronous control program that has the same function as that of the embodiment, in other words, a gain setting program 631, a received signal amplification program 632, a synchronizing signal detection program 633, and an initial synchronous control program 634 as illustrated in FIG. 12. Moreover, similarly to each unit of the mobile terminal station 10 illustrated in FIG. 1, the programs 631 to 634 may be appropriately integrated or dispersed.

The CPU 640 reads out and executes the programs 631 to 634 from the ROM 630, and thus the programs 631 to 634 function as a gain setting process 641, a received signal amplification process 642, a synchronizing signal detection process 643, and an initial synchronous control process 644 as illustrated in FIG. 12. The processes 641 to 644 correspond to the gain setting unit 19, the VGA 12, the synchronizing signal detecting unit 18, and the initial synchronous control unit 21 illustrated in FIG. 1, respectively.

Moreover, as illustrated in FIG. 12, a gain set value/synchronization detection time table 611 is provided in the HDD 610. Moreover, the gain set value/synchronization detection time table 611 corresponds to the gain set value/synchronization detection time holding unit 20 illustrated in FIG. 1. The CPU 640 registers data in the gain set value/synchronization detection time table 611 and reads out gain set value/synchronization detection time data 621 from the gain set value/synchronization detection time table 611 to store the data in the RAM 620, and executes a process for managing information on the basis of the gain set value/synchronization detection time data 621 stored in the RAM 620.

As described above, according to an aspect of the present invention, a synchronous process can be smoothly performed. Moreover, it is possible to prevent a signal having an excessive electric power from being received.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A mobile terminal station comprising:
a gain setting unit that sets a fixed gain set value that is a predetermined gain value at initial synchronization;
a received signal amplifying unit that amplifies a received signal received from a base station in accordance with the fixed gain set value set by the gain setting unit;
a synchronizing signal detecting unit that detects a synchronizing signal pattern from the received signal amplified by the received signal amplifying unit; and
a fixed gain set value control unit that performs an automatic gain control by using the fixed gain set value as an initial value of the automatic gain control when the synchronizing signal pattern is detected by the synchronizing signal detecting unit, and that modifies the fixed gain set value set by the gain setting unit when the synchronizing signal pattern is not detected,
wherein, when the fixed gain set value control unit modifies the fixed gain set value, the received signal amplifying unit, the synchronizing signal detecting unit, and the fixed gain set value control unit performs subsequent processes based on the fixed gain set value modified by the fixed gain set value control unit.

2. The mobile terminal station according to claim 1, further comprising a synchronization detection time control unit that sets a synchronization detection time that is a time period for detecting a synchronizing signal for each fixed gain set value in accordance with a time for the detection of the synchronizing signal pattern performed by the synchronizing signal detecting unit and a detection probability of the synchronizing signal pattern, wherein
the fixed gain set value control unit controls to modify the fixed gain set value when the synchronizing signal pattern is not detected in the synchronization detection time set by the synchronization detection time control unit.

3. The mobile terminal station according to claim 2, wherein
the fixed gain set value control unit sets the fixed gain set value in accordance with a distribution of received powers at a position of the mobile terminal station, and
the synchronization detection time control unit sets the synchronization detection time in accordance with the distribution of received powers.

4. The mobile terminal station according to claim 3, further comprising a distribution information extracting unit that extracts information on to the distribution of received powers from the received signal, wherein
the fixed gain set value control unit sets the fixed gain set value in accordance with the distribution of received powers extracted by the distribution information extracting unit, and the synchronization detection time control unit sets the synchronization detection time in accordance with the distribution of received powers extracted by the distribution information extracting unit.

5. The mobile terminal station according to claim 3, further comprising a distribution statistics processing unit that performs statistical processing on the fixed gain set value, the synchronization detection time, and position information of the mobile terminal station when the synchronizing signal pattern is detected by the synchronization detection time control unit and creates a distribution of received powers, wherein the fixed gain set value control unit sets the fixed gain set value in accordance with the distribution of received powers created by the distribution statistics processing unit, and the synchronization detection time control unit sets the synchronization detection time in accordance with the distribution of received powers created by the distribution statistics processing unit.

6. The mobile terminal station according to claim 1, further comprising:

a moving state detecting unit that detects information on a moving state of the mobile terminal station; and a synchronization detection time control unit that sets a synchronization detection time that is a time period for detecting a synchronizing signal for each fixed gain set value in accordance with the information on the moving state detected by the moving state detecting unit, wherein the fixed gain set value control unit modifies the fixed gain set value when the synchronizing signal pattern is not detected in the synchronization detection time set by the synchronization detection time control unit.

7. The mobile terminal station according to claim 6, wherein the fixed gain set value control unit sets the fixed gain set value in accordance with a distribution of received powers at a position of the mobile terminal station, and the synchronization detection time control unit sets the synchronization detection time in accordance with the distribution of received powers.

8. The mobile terminal station according to claim 7, further comprising a distribution information extracting unit that extracts information on to the distribution of received powers from the received signal, wherein the fixed gain set value control unit sets the fixed gain set value in accordance with the distribution of received powers extracted by the distribution information extracting unit, and the synchronization detection time control unit sets the synchronization detection time in accordance with the distribution of received powers extracted by the distribution information extracting unit.

9. The mobile terminal station according to claim 7, further comprising a distribution statistics processing unit that performs statistical processing on the fixed gain set value, the synchronization detection time, and position information of the mobile terminal station when the synchronizing signal pattern is detected by the synchronization detection time control unit and creates a distribution of received powers, wherein the fixed gain set value control unit sets the fixed gain set value in accordance with the distribution of received powers created by the distribution statistics processing unit, and the synchronization detection time control unit sets the synchronization detection time in accordance with the distribution of received powers created by the distribution statistics processing unit.

10. A synchronous control method comprising:

setting a fixed gain set value that is a predetermined gain value at initial synchronization;

amplifying a received signal received from a base station in accordance with the fixed gain set value;

detecting a synchronizing signal pattern from the received signal amplified at the amplifying; and performing an automatic gain control by using the fixed gain set value as an initial value of the automatic gain control when the synchronizing signal pattern is detected, and modifying the fixed gain set value set in the setting when the synchronizing signal pattern is not detected, wherein, when the fixed gain set value is modified in the performing, subsequent processes of the amplifying, the detecting, and the performing are performed based on the fixed gain set value modified in the performing.

11. The synchronous control method according to claim 10, further comprising setting a synchronization detection time that is a time period for detecting a synchronizing signal for each fixed gain set value in accordance with a time for the detection of the synchronizing signal pattern performed at the detecting and a detection probability of the synchronizing signal pattern, wherein the modifying includes modifying the fixed gain set value when the synchronizing signal pattern is not detected in the synchronization detection time.

12. The synchronous control method according to claim 11, wherein the setting the fixed gain set value includes setting the fixed gain set value in accordance with a distribution of received powers at a position of a mobile terminal station, and the setting the synchronization detection time includes setting the synchronization detection time in accordance with the distribution of received powers.

13. The synchronous control method according to claim 12, further comprising extracting information on to the distribution of received powers from the received signal, wherein the setting the fixed gain set value includes setting the fixed gain set value in accordance with the extracted distribution of received powers, and the setting the synchronization detection time includes setting the synchronization detection time in accordance with the extracted distribution of received powers.

14. The synchronous control method according to claim 12, further comprising performing statistical processing on the fixed gain set value, the synchronization detection time, and position information of the mobile terminal station when the synchronizing signal pattern is detected and creating a distribution of received powers, wherein the setting the fixed gain set value includes setting the fixed gain set value in accordance with the distribution of received powers created at the creating, and the setting the synchronization detection time includes setting the synchronization detection time in accordance with the distribution of received powers created at the creating.

15. The synchronous control method according to claim 10, further comprising:

detecting information on a moving state of a mobile terminal station; and setting a synchronization detection time that is a time period for detecting a synchronizing signal for each fixed gain set value in accordance with the information on the moving state, wherein the modifying includes modifying the fixed gain set value when the synchronizing signal pattern is not detected in the synchronization detection time.

16. The synchronous control method according to claim 15, wherein the setting the fixed gain set value includes setting the fixed gain set value in accordance with a distribution of received powers at a position of the mobile terminal station, and the synchronization detection time control unit sets the synchronization detection time in accordance with the distribution of received powers.

17. The synchronous control method according to claim 16, further comprising extracting information on to the distribution of received powers from the received signal, wherein the setting the fixed gain set value includes setting the fixed gain set value in accordance with the extracted distribution of received powers, and the setting the synchronization detection time includes setting the synchronization detection time in accordance with the extracted distribution of received powers.

18. The synchronous control method according to claim 16, further comprising performing statistical processing on the fixed gain set value, the synchronization detection time, and position information of the mobile terminal station when the synchronizing signal pattern is detected and creating a distribution of received powers, wherein the setting the fixed gain set value includes setting the fixed gain set value in accordance with the distribution of received powers created at the creating, and the setting the synchronization detection time includes setting the synchronization detection time in accordance with the distribution of received powers created at the creating.

19. A non-transitory computer readable storage medium having stored therein a synchronous control program causing a computer to execute a process comprising:

setting a fixed gain set value that is a predetermined gain value at initial synchronization;

amplifying a received signal received from a base station in accordance with the fixed gain set value;

detecting a synchronizing signal pattern from the received signal amplified at the amplifying; and performing an automatic gain control by using the fixed gain set value as an initial value of the automatic gain control when the synchronizing signal pattern is detected, and modifying the fixed gain set value set in the setting when the synchronizing signal pattern is not detected, wherein, when the fixed gain set value is modified in the performing, subsequent processes of the amplifying, the detecting, and the performing are performed based on the fixed gain set value modified in the performing.

20. The non-transitory computer readable storage medium according to claim 19, wherein the process further comprises setting a synchronization detection time that is a time period for detecting a synchronizing signal for each fixed gain set value in accordance with a time for the detection of the synchronizing signal pattern performed at the detecting and a detection probability of the synchronizing signal pattern, wherein the modifying includes modifying the fixed gain set value when the synchronizing signal pattern is not detected in the synchronization detection time.

* * * * *